United States Patent [19]

Balakrishnan

[11] Patent Number: 4,533,839
[45] Date of Patent: Aug. 6, 1985

[54] CURRENT LIMITING CIRCUIT FOR HIGH CURRENT PERIPHERAL DRIVERS

[75] Inventor: Ramanatha V. Balakrishnan, San Jose, Calif.

[73] Assignee: National Semiconductor Corporation, Santa Clara, Calif.

[21] Appl. No.: 456,934

[22] Filed: Jan. 10, 1983

[51] Int. Cl.³ .................. H03K 17/60; H03K 3/26
[52] U.S. Cl. ............................ 307/270; 307/254; 307/300
[58] Field of Search .......... 307/270, 254, 255, 359, 307/300

[56] References Cited

U.S. PATENT DOCUMENTS

| | | | |
|---|---|---|---|
| 4,318,011 | 3/1982 | Zeis | 307/359 |
| 4,404,478 | 9/1983 | Rischmüller | 307/359 |
| 4,427,902 | 1/1984 | Hickman et al. | 307/270 |
| 4,469,082 | 9/1984 | Nishitoba et al. | 307/359 |

Primary Examiner—Stanley D. Miller
Assistant Examiner—B. P. Davis
Attorney, Agent, or Firm—Gail W. Woodward; Paul J. Winters; Michael J. Pollock

[57] ABSTRACT

In a peripheral driver circuit a switching output transistor is operated from digital logic control and is provided with a shut off circuit which turns the output transistor off when its collector supply current exceeds its saturation current. A controlled base drive current is generated in a circuit that includes a scaled reference transistor that is operated at the same current density and the same collector voltage as the output transistor at its rated current. The reference transistor base current is amplified in a circuit having a current gain equal to the scaling between the reference and output transistors. Thus the base current applied to the output transistor is related to the driver rated current which ensures that saturation will occur up to at least the rated current and above which the shut off will be effective.

10 Claims, 2 Drawing Figures

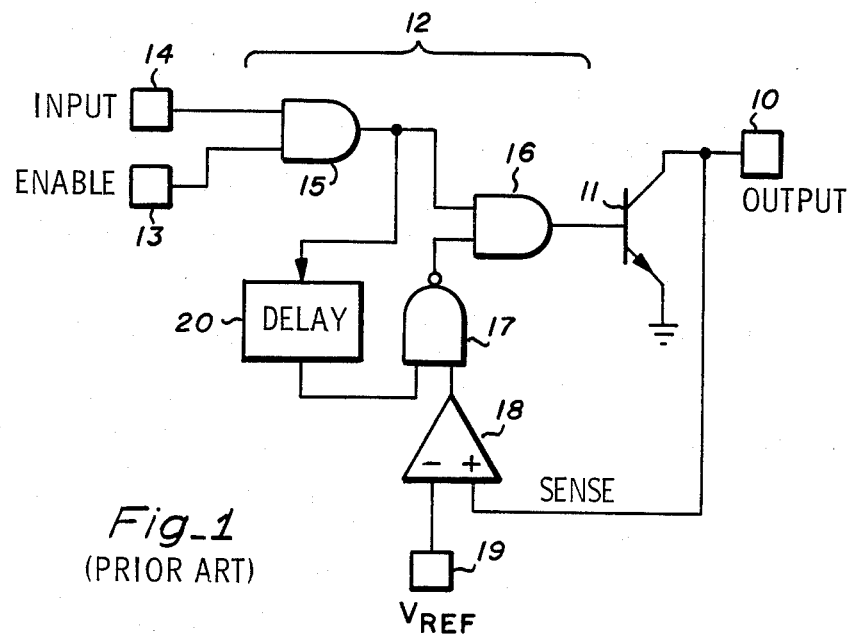
Fig_1 (PRIOR ART)
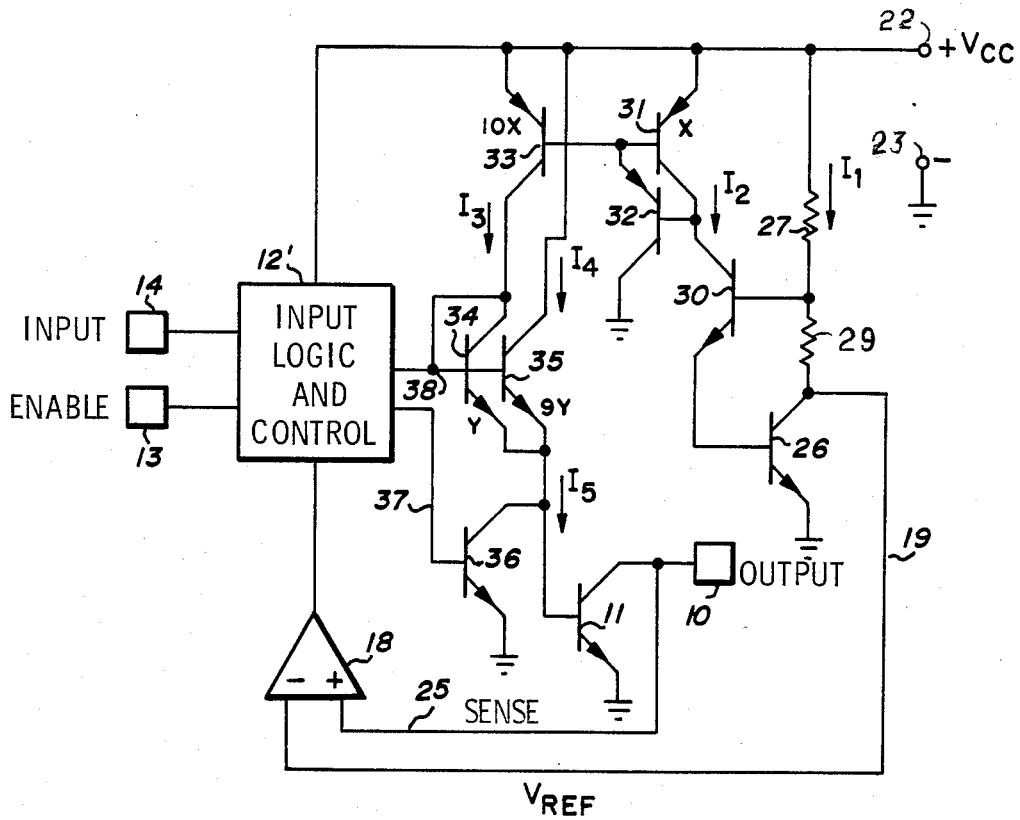
Fig_2

4,533,839

CURRENT LIMITING CIRCUIT FOR HIGH CURRENT PERIPHERAL DRIVERS

BACKGROUND OF THE INVENTION

Peripheral drivers are digital interface devices which act to switch high current high voltage loads in response to digital logical input signals. Such loads may involve relays, solenoids, motors, or other such elements. Desirably such drivers can handle high voltage (and often inductive) loads that require high currents, respond to conventional digital control signals and drain very little current from their operating power supply. It has become common to incorporate an uncommitted collector transistor, which will act as a switch, into an integrated circuit (IC) chip along with the associated operating circuits. Typically conventional bipolar, junction isolated, monolithic silicon IC construction is employed.

SUMMARY OF THE INVENTION

It is an object of the invention to provide a peripheral driver in which an uncommitted output transistor collector is sensed to provide shut off protection and is operated so that the protection is related only to sink current and not transistor beta.

It is a further object of the invention to control the protective shut off current level in a peripheral driver transistor using circuits that rely upon geometrical factors rather than processing variables.

These and other objects are achieved as follows. An uncommitted collector output transistor, employed in a peripheral driver configuration, is protected using a collector voltage sensing circuit that turns the transistor off when the sinking current capability is exceeded by the current being applied. A reference current is developed and applied to a saturated reference transistor that is operated at the same current density and collector to emitter voltage as the output transistor at its maximum current rating. The base current of the reference transistor is applied, via a succession of current mirrors that multiply in accordance with their geometrical ratios, to the base of the output transistor. This base current drive is applied to the output transistor so that when multiplied by the transistor beta, is the output transistor collector sink current. At the maximum current the beta ratio between the reference and output transistors is close to unity. This means that the maximum sink current is determined solely by the geometrical ratios in the current mirrors and is not related to variables that are process sensitive.

BRIEF DESCRIPTION OF THE DRAWING

FIG. 1 is a logic-schematic diagram of a conventional prior art peripheral driver with an overcurrent protection circuit.

FIG. 2 is a schematic diagram of the circuit of the invention.

DESCRIPTION OF THE PRIOR ART

FIG. 1 is a schematic-logic diagram of a prior art peripheral driver circuit. It is to be understood that while a single channel device is shown, typical structures involve a quad or four channel configuration on a single IC chip housed in a single IC package.

The heart of the driver is NPN transistor 11 which is to act as a switched current sink. Its uncommitted collector is available via terminal 10 and it will sink current fed into terminal 10 to ground. Conduction in transistor 11 is conditioned by logic circuitry 12 in response to logic signals applied to terminals 13 and 14. When enable terminal 13 is high, input terminal 14 will turn conduction in transistor 11 on and off in response to logic ones and zeros respectively. This is accomplished by AND gates 15 and 16. AND gate 16, which is coupled to drive the base of transistor 11, is operated from AND gate 15 and NAND gate 17. In operation when the output of gate 15 is high, and after a short delay of about 500 n seconds due to delay 20, the left hand input of gate 17 will be high so it acts as an inverter in response to its other input which is obtained from comparator 18. The inverting input of comparator 18 is supplied with $V_{REF}$, a reference potential which is selected to be intermediate between the transistor 11 saturation voltage ($V_{SAT}$) and the specified maximum $V_{OL}$ at maximum output current.

$$V_{SAT} < V_{REF} \leq V_{OL}$$

In this application, $V_{REF}$ is chosen to be $2V_{BE} \approx 1.4$ V and $V_{OL} = 1.5$ V.

Normally gate 16 forces base current into transistor 11 which is thereby saturated and its collector voltage will be at $V_{SAT}$ which is ordinarily well below $2V_{BE}$. (The above referenced 1.4 volts is $2V_{BE}$ at about $-25°$ C. for a typical silicon power transistor.) This will drive the output of comparator 18 low which, via NAND gate 17, will drive the lower input of AND gate 16 high so as to drive base current into the base of transistor 11. When the current flowing into terminal 10 exceeds the saturation current capability of transistor 11 the current source will pull the collector up above $V_{SAT}$.

When the collector of transistor 11 exceeds $V_{REF}$ the output of comparator 18 will go high and NAND gate 17 output will go low which will turn off gate 16 and transistor 11. Thus transistor 11 is protected from excess currents.

Once transistor 11 is turned off it will stay off until toggled back on. Assuming that the excess current flowing into terminal 10 has been removed and terminal 10 is low, this can be done by pulsing either of terminals 13 or 14 (or both) to a low state for the duration of delay 20 and then returning it (or them) high.

The delay 20 is provided for the following purpose. When the output is turned on by applying a high logic level to the inputs the terminal 10 will take some time to reach the $V_{SAT}$ level from its high level (determined by the load voltage). During this time, comparator output will be high signalling an excess current. But the delay circuit output will prevent this from shutting off the output transistor (11) by holding the left input of the NAND gate 17 low for the duration of the delay. The delay is chosen to be $\geq$ to the worst case high to low transition time of the output terminal.

While the circuit of FIG. 1 affords protection, the current input level at which turn off occurs is a function of the Beta (base to collector current gain) of transistor 11. This is due to the fact that gate 16 will ordinarily supply a relatively fixed current to the base of transistor 11 and the sinking capability will be equal to $I_{BASE} \times$ Beta. Since Beta will be a function of the manufacturing process and can typically vary over a range of about $-50\%$ to $+200\%$ of its nominal value, the protection afforded by the circuit is quite variable. It would be desirable to provide protection when a known sinking current is reached and to make the value independent of transistor Beta.

DESCRIPTION OF THE INVENTION

FIG. 2 is a schematic diagram of the circuit of the invention. The prior art logic and control functions are incorporated into block 12'. This would include the functions of gates 15, 16 and 17 along with delay 20. The circuit is operated from a $V_{CC}$ power supply connected between terminal 22 and ground terminal 23. Sense line 25 which couples the collector voltage of transistor 11 to the comparator 18 to provide the shut off sensing as was described above.

The $V_{REF}$ terminal '19' of the comparator is now connected to the collector of transistor 26. Such a connection provides an accurate detection of excess current by comparison of the $V_{SAT}$ voltages of two transistors 11 and 26 operating under identical emitter current densities and collector to emitter voltage levels.

Reference transistor 26 is made similar to output transistor 11 but on a much smaller scale (for example transistor 26 can be 1/100 of the area of transistor 11). Transistor 30 is connected as a source follower between node 28 and the base of transistor 26 which forces the voltage at node 28 to be $\approx 2V_{BE}$ from ground. $I_1$ is the current flowing in resistor 27. The magnitude of $I_1$ is:

$$I_1 = (V_{CC} - V_{BE26} - V_{BE30})/R_{27} \qquad (1)$$

where: The $V_{BE}$ values are the base to emitter voltages of the referenced transistors and $R_{27}$ is the value of resistor 27. $I_1$ is selected to maintain a current density equal to that of transistor 11 under full load in transistor 26 which, since it is ratioed at 1/100 with respect to transistor 11, can be relatively small. Accordingly, if the sink is to be rated at one ampere, $I_1$ will be 10 mA. If the sink is to be rated at 100 mA, $I_1$ will be 1 mA.

Since node 28 is at $2V_{BE}$ above ground, resistor 29 is included in the circuit so that the collector of transistor 26 can be dropped to a level that is equal to the maximum $V_{SAT}$ tolerable on transistor 11. Its value will be:

$$R_{29} = (V_{BE26} + V_{BE30} - V_{SAT(MAX)11})/I_1 \qquad (2)$$

where: $V_{SAT(MAX)11}$ is the saturation voltage of transistor 11 at its maximum rated current.

$I_2$ which is the base current of transistor 26, will be equal to $I_1$/Beta 26. $I_2$ is coupled as the input current to a current mirror composed of transistors 31-33. Transistor 31 passes $I_2$ and is forced to operate as a diode by emitter follower connected transistor 32. Mirror output transistor 33 conducts $I_3$ which will be $10I_1$ by virtue of the 1:10 area scaling between transistors 31 and 33. Thus $I_3$ equals $10I_1$/Beta 26.

$I_3$ flows in diode connected transistor 34. The emitter-base circuit of transistor 35 parallels that of transistor 34 and, since transistor 35 has nine times the area of transistor 34, it will conduct $I_4$ which is $90I_1$/Beta 26. Since $I_5$, which is the base current drive of transistor 11, equals $I_3 + I_4$ the base current drive is $100I_1$/Beta 26. The collector current of transistor 11 due to this base drive will be $100I_1 \times$ Beta 11/Beta 26. Since transistor 26 was scaled at 1/100 of transistor 11 this Beta ratio will be very close to unity because the two transistors are at the same current density and saturated to the same degree at the comparator trigger point. Thus the current sink capability at terminal 10 will be $100I_1$ and the current shut off protection will function at the desired current level. This level will be determined by the area ratios of transistors 31 to 33 and transistors 34 to 35. Since such area ratios do not vary with the IC device processing, the shut off protection is not dependent on process sensitive parameters.

To complete the circuit explanation it will be noted that transistor 36 is present to pull the base of transistor 11 low when it is to be shut off. Thus line 37 will be pulled up by the circuitry in block 12' in the off state. During shut off line 38 will be low. Line 38 is released when the on state is selected and for this state line 37 will be low so as to turn transistor 36 off.

The invention has been described and its operation set forth in detail. When a person skilled in the art reads the forgoing description, alternatives and equivalents, within the spirit and intent of the invention, will become apparent. Accordingly it is intended that the scope of the invention be limited only by the claims that follow.

I claim:

1. In a peripheral driver circuit which includes at least one current sink transistor having an uncommitted collector that can sink a substantial current in response to a logic operated base current and wherein said logic further responds to the voltage present on said uncommitted collector whereby said current sink transistor is turned off when said voltage exceeds a predetermined reference potential so that when said current sink transistor is driven from a current source that exceeds its saturation capability it is protected, the improvement comprising:
    a reference transistor;
    means for passing a reference current through said reference transistor; and
    means, responsive to said reference current, for developing a controlled base current drive for said current sink transistor whereby its saturation current is limited to a safe design value.

2. The improvement of claim 1 wherein said reference current is selected to operate said reference transistor at a current density that is close to that of said current sink transistor at saturation.

3. The improvement of claim 2 further including means coupled to said reference transistor to force it into saturation when operated at said reference current.

4. The improvement of claim 3 wherein said means for developing a controlled base current drive further includes current amplifying means responsive to the base current of said reference transistor and having a current gain determined by geometrical factors.

5. The improvement of claim 4 wherein said current amplifying means comprise current mirror means.

6. The improvement of claim 4 wherein said reference transistor is made smaller than said current sink transistor by a ratio equal to said current gain of said current amplifying means.

7. The improvement of claim 6 wherein said logic includes a comparator having one input coupled to the collector of said reference transistor and the other input coupled to the collector of said current sink transistor.

8. A peripheral driver circuit comprising
    a current sink transistor having an uncommitted collector, an emitter coupled to a supply terminal capable of sinking said current, and a base;
    means for generating a base current for said current sink transistor that is a controlled fraction of the rated current of said current sink transistor, said means for generating including a reference transistor that is scaled in size at said controlled fraction with respect to said current sink transistor and a reference current equal to said rated current divided by said controlled fraction is passed through said reference transistor whereby said reference transistor operates at the same current density as said current sink transistor at its rated current and develops a reference voltage that is equal to the voltage on said collector of said current sink transistor at its rated current;

means for applying said base current to said base of said current sink transistor;

means for sensing when said rated current is exceeded; and means responsive to said sensing means for terminating said base current when said means for sensing indicates that said rated current is exceeded.

9. The circuit of claim 8 wherein said means for generating further includes current mirror means having a current gain equal to the reciprocal of said controlled fraction whereby said base current is developed by means of a geometrically determined ratio that multiply the current in said reference transistor.

10. The circuit of claim 9 wherein said base current is terminated in response to the action of a comparator having a first input coupled to said collector of said current sink transistor and a second input coupled to the collector of said reference transistor whereby said current is terminated when said first input exceeds said second input so that said current sink transistor is turned off when its rated current is exceeded without regard to its current gain.

* * * * *